US008846468B2

United States Patent
Rui et al.

(10) Patent No.: US 8,846,468 B2
(45) Date of Patent: *Sep. 30, 2014

(54) METHODS TO IMPROVE LEAKAGE OF HIGH K MATERIALS

(71) Applicants: Intermolecular, Inc., San Jose, CA (US); Elpida Memory, Inc, Tokyo (JP)

(72) Inventors: Xiangxin Rui, Campbell, CA (US); Sergey Barabash, San Jose, CA (US)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/716,375

(22) Filed: Dec. 17, 2012

(65) Prior Publication Data

US 2014/0170833 A1 Jun. 19, 2014

(51) Int. Cl.
*H01L 21/00* (2006.01)
*H01L 49/02* (2006.01)

(52) U.S. Cl.
CPC .................................. *H01L 28/40* (2013.01)
USPC ................ 438/240; 257/532; 257/E21.008; 257/E29.342; 438/250

(58) Field of Classification Search
CPC ......................... H01L 28/40; H01L 27/0805
USPC .......... 257/296, 306, 532, E29.342, E29.343, 257/E21.008; 438/239, 240, 250
See application file for complete search history.

(56) References Cited

U.S. PATENT DOCUMENTS

| 5,106,796 | A  | * | 4/1992  | Drozdyk et al. ............. 501/137 |
| 5,814,849 | A  | * | 9/1998  | Azuma et al. ............... 257/295 |
| 5,943,569 | A  | * | 8/1999  | Shih et al. .................. 438/253 |
| 8,278,735 | B2 |   | 10/2012 | Hashim et al. |
| 8,415,227 | B2 |   | 4/2013  | Malhotra et al. |
| 2004/0087081 | A1 | * | 5/2004  | Aitchison et al. ............ 438/240 |
| 2006/0163632 | A1 | * | 7/2006  | Basceri et al. .............. 257/296 |
| 2008/0173919 | A1 | * | 7/2008  | Kudelka et al. ............. 257/306 |
| 2009/0173979 | A1 |   | 7/2009  | Ahn et al. |
| 2009/0297696 | A1 |   | 12/2009 | Pore et al. |
| 2010/0330269 | A1 |   | 12/2010 | Chen et al. |
| 2011/0014359 | A1 |   | 1/2011  | Hashim et al. |
| 2012/0127629 | A1 | * | 5/2012  | Roeder et al. ............... 361/322 |
| 2012/0280369 | A1 | * | 11/2012 | Saito et al. ................. 257/629 |

OTHER PUBLICATIONS

Arroyave, R., et al.; Thermodynamic Modeling of the Zr-O System; Elsevier Science Ltd.; 2002; Calphad, vol. 26, No. 1, pp. 95-118.
Umezawa, N.; Effects of capping HfO2 with multivalent oxides toward reducing the number of charged defects; Apr. 23, 2010; American Institute of Phsics; Applied Physics Letters 96 162906, 3 pages.

* cited by examiner

Primary Examiner — Allan R Wilson

(57) ABSTRACT

A method for reducing the leakage current in DRAM Metal-Insulator-Metal capacitors includes forming a capacitor stack including an oxygen donor dopant incorporated within the dielectric layer. The oxygen donor dopants may be incorporated within the dielectric layer during the formation of the dielectric layer. The oxygen donor materials provide oxygen to the dielectric layer and reduce the concentration of oxygen vacancies, thus reducing the leakage current.

15 Claims, 6 Drawing Sheets

METHODS TO IMPROVE LEAKAGE OF HIGH K MATERIALS

This document relates to the subject matter of a joint research agreement between Intermolecular, Inc. and Elpida Memory, Inc.

FIELD OF THE DISCLOSURE

The present disclosure relates generally to the field of dynamic random access memory (DRAM), and more particularly to methods of forming a capacitor stack for improved DRAM performance.

BACKGROUND OF THE DISCLOSURE

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A $cm^{-2}$). The physical thickness of the dielectric layers in DRAM capacitors could not be reduced unlimitedly in order to avoid leakage current caused by tunneling mechanisms which exponentially increase as the thickness of the dielectric layer decreases.

Traditionally, $SiO_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the $SiO_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of $SiO_2$ (k=3.9). For DRAM capacitors, the goal is to utilize dielectric materials with k values greater than about 20. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to $SiO_2$ known as the Equivalent Oxide Thickness (EOT). A high-k material's EOT is calculated using a normalized measure of silicon dioxide ($SiO_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium dioxide and zirconium dioxide are two metal oxide dielectric materials which display significant promise in terms of serving as high-k dielectric materials for implementation in DRAM capacitors. Other metal oxide high-k dielectric materials that have attracted attention include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, or combinations thereof.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Leakage current in capacitor dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the heat-induced flow of charge over an energy barrier whereby the effective barrier height of a MIM capacitor controls leakage current. The effective barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through tunneling. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

SUMMARY OF THE DISCLOSURE

The following summary of the disclosure is included in order to provide a basic understanding of some aspects and features of the disclosure. This summary is not an extensive overview of the disclosure and as such it is not intended to particularly identify key or critical elements of the disclosure or to delineate the scope of the disclosure. Its sole purpose is to present some concepts of the disclosure in a simplified form as a prelude to the more detailed description that is presented below.

In some embodiments, oxygen donor layers are formed adjacent to high-k dielectric layers to reduce the leakage current through capacitor stacks. The materials used for the oxygen donor layers are selected such that it is thermodynamically favorable for the oxygen donor layers to provide oxygen to the high-k dielectric layer. Without being bound by theory, it is believed that this donation of oxygen to the high-k dielectric material fills oxygen vacancies in the high-k dielectric layer and reduces the leakage current.

In some embodiments, oxygen donor dopants are incorporated into high-k dielectric layer to reduce the leakage current through capacitor stacks. The materials used for the oxygen donor dopants are selected such that it is thermodynamically favorable for the oxygen donor dopants to provide oxygen to the high-k dielectric layer. Without being bound by theory, it is believed that this donation of oxygen to the high-k dielectric layer fills oxygen vacancies in the high-k dielectric layer and reduces the leakage current.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present disclosure can readily be understood by considering the following detailed description in conjunction with the accompanying drawings, in which.

DETAILED DESCRIPTION

Figure 1:
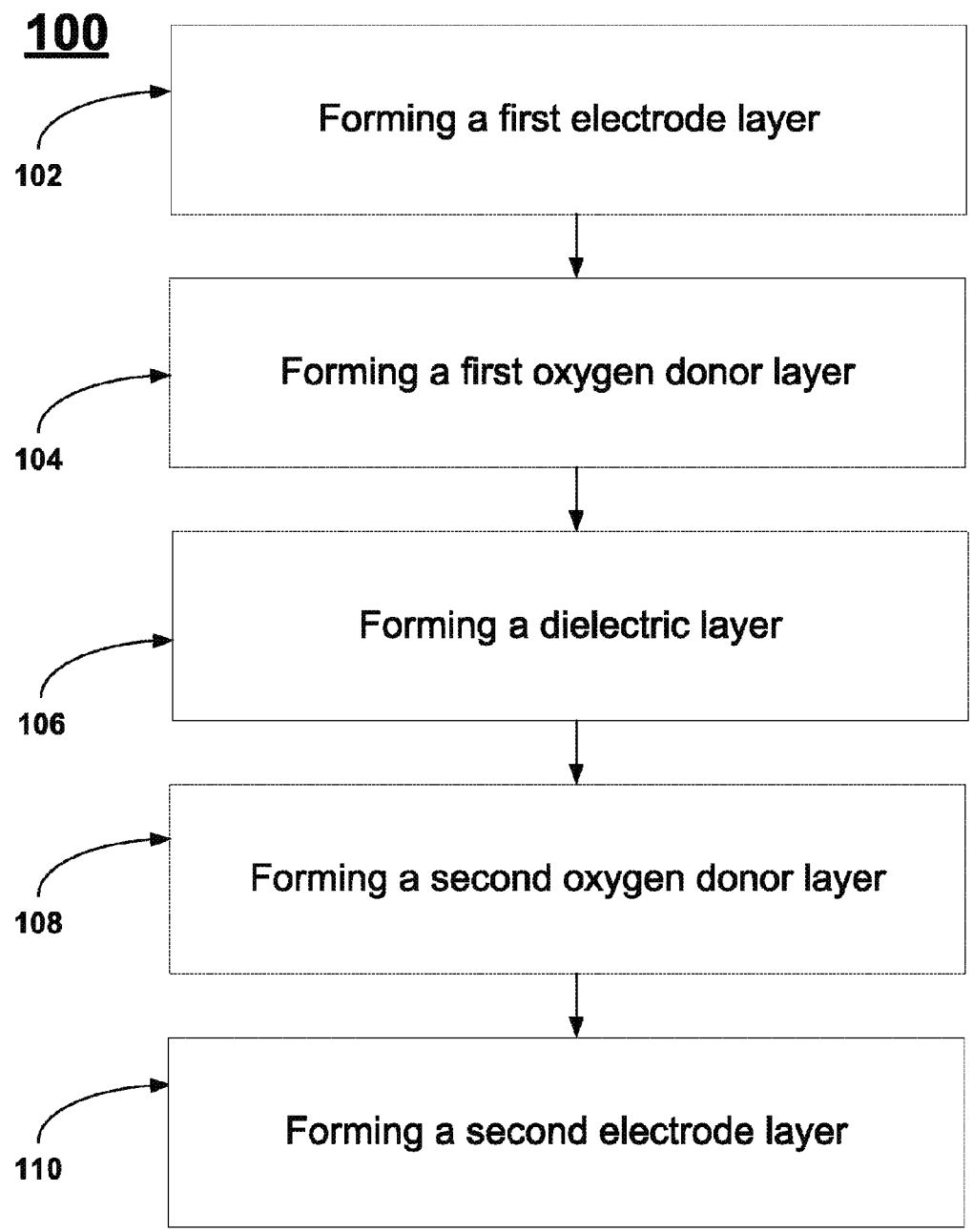
FIG. 1 illustrates a flow chart describing a method for fabricating a DRAM capacitor stack in accordance with some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Metal oxide dielectric materials typically have a number of defects, including oxygen vacancies. As discussed previously, these defects contribute to leakage current through the dielectric material via a Frenkel-Poole mechanism. Methods to reduce the concentration of oxygen vacancies in metal oxide dielectric materials include the use of anneal treatments in an oxygen-containing atmosphere after the deposition of the dielectric material. However, increases in the leakage current of metal oxide dielectric materials are sometimes observed after subsequent processing steps, indicating that a more permanent solution is desired.

The transport of oxygen between adjacent metal oxide materials depends upon their relative stability, chemical potentials, and free energy of formation. The relative stability of metal oxides can be determined by using their Ellingham diagrams. The Ellingham diagrams present the temperature dependence of the Gibb's free energy. For metallic oxides, the Ellingham diagram is a straight line with positive slope. Metal oxides that are "lower" on the diagram (i.e. more negative Gibb's free energy) are more stable than metal oxides that are higher on the diagram. Therefore, metal oxides that are higher on the diagram will donate oxygen to metal oxides that are lower on the diagram. An extreme example is the reduction of iron oxide by aluminum to form aluminum oxide in the well known thermite reaction. The aluminum oxide has a lower (i.e. more negative) Gibb's free energy change of formation than the iron oxide and the formation of the aluminum oxide is thermodynamically more favorable than the formation of iron oxide. These same principles also hold for other metal/metal oxide or metal oxide/metal oxide pairs.

Metal oxide materials can be selected that can act as oxygen donors to the dielectric material. The selection can include materials wherein the dielectric material may reduce (e.g. take oxygen from) the oxygen donor material. The oxygen donor material should have a number of stoichiometric oxide compositions that are stable. As an example, if the dielectric material is zirconium oxide, then examples of suitable oxygen donor materials (e.g. they are above zirconium oxide on the Ellingham diagram) include chromium oxide, tungsten oxide, tin oxide, vanadium oxide, titanium oxide, tantalum oxide, manganese oxide, molybdenum oxide, niobium oxide, etc. As an example, if the dielectric material is titanium oxide, then examples of suitable oxygen donor materials (e.g. they are above zirconium oxide on the Ellingham diagram) include chromium oxide, tungsten oxide, tin oxide, vanadium oxide, tantalum oxide, manganese oxide, molybdenum oxide, niobium oxide, etc.

The inclusion of the oxygen donor material in the capacitor stack should not have a negative impact on the k value or the EOT of the capacitor stack. Therefore, the oxygen donor material should be moderately conductive so that it may be treated as part of the electrode structure and not part of the dielectric portion of the capacitor stack.

FIG. 1 describes a method, 100, for fabricating a DRAM capacitor stack. The initial step, 102, involves forming a first electrode layer on a substrate. Examples of suitable electrode layers include metals, metal alloys, conductive metal oxides, conductive metal silicides, conductive metal nitrides, or combinations thereof. Two particularly interesting classes of materials are the conductive metal oxides and the conductive metal nitrides. Optionally, the first electrode layer can then be subjected to an annealing process (not shown). If the first electrode layer is a conductive metal nitride material, then the first electrode layer may be annealed using a Rapid Thermal Anneal (RTA) technique or furnace anneal technique. For the RTA case, the temperature is quickly raised in the presence of a nitrogen containing gas such as nitrogen, forming gas, ammonia, etc. Examples of such electrode treatment steps are further described in U.S. application Ser. No. 13/051,531 filed on Mar. 18, 2011, which is incorporated herein by reference for all purposes. Alternatively, if the first electrode is a conductive metal oxide, then the first electrode layer may be annealed in an inert or reducing atmosphere such as argon, nitrogen, or forming gas. Examples of such an annealing process is further described in U.S. application Ser. No. 13/084,666 filed on Apr. 12, 2011, entitled "METHOD FOR FABRICATING A DRAM CAPACITOR" which is incorporated herein by reference for all purposes.

The next step, 104, involves forming a first oxygen donor layer above the first electrode layer. As used herein, an "oxygen donor layer" will be understood to describe a layer wherein the material that forms the layer has a higher (i.e., less negative) Gibb's free energy change of formation than the adjacent dielectric material. This layer may donate oxygen to the dielectric layer, thereby reducing the concentration of oxygen vacancies, and thus reduce the leakage current of the capacitor stack as discussed previously. The thickness of the first oxygen donor layer is typically between 1 A and 25 A. The next step, 106, includes forming a dielectric layer above the first oxygen donor layer. The dielectric layer may be a single layer or may be formed from multiple layers. The dielectric layer may include a dopant. As used herein, the dopant may be electrically active or not electrically active. The definition of a "dopant" excludes residues and impurities such as carbon, etc. that may be present in the material due to inefficiencies of the process or impurities in the precursor materials. The next step, 108, includes forming a second oxygen donor layer above the dielectric layer. The thickness of the second oxygen donor layer is typically between 1 A and 25 A. This layer may also donate oxygen to the dielectric layer and thus reduce the leakage current of the capacitor stack as discussed previously. In some embodiments, the second oxygen donor layer has the same composition as the first oxygen donor layer. In some embodiments, the second oxygen donor layer has a different composition from the first oxygen donor layer.

The crystalline phases of dielectric materials exhibit higher k values than their amorphous phases. Therefore, there is often an optional anneal step either after the dielectric formation step (also known as a post dielectric anneal (PDA)) or an anneal step after the formation of the second electrode (also known as a post metallization anneal (PMA)) to crystallize at least a portion of the dielectric layer. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" which is incorporated herein by reference for all purposes.

The next step, 110, involves forming a second electrode layer above the second oxygen donor layer to form a capacitor stack. Typically, the capacitor stack can then be subjected to a PMA annealing process (not shown) as discussed previously.

Those skilled in the art will appreciate that each of the first electrode layer, the first oxygen donor layer, the dielectric layer, the second oxygen donor layer, and the second electrode layer used in the DRAM MIM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed herein. Those skilled in the art will appreciate that the teachings described herein are not limited by the technology used for the deposition process.

In FIGS. 2, 4, 5, and 6, a capacitor stack is illustrated using a simple planar structure. Those skilled in the art will appreciate that the description and teachings herein can be readily applied to any simple or complex capacitor morphology. The drawings are for illustrative purposes only and do not limit the application of the present disclosure.

Figure 2:
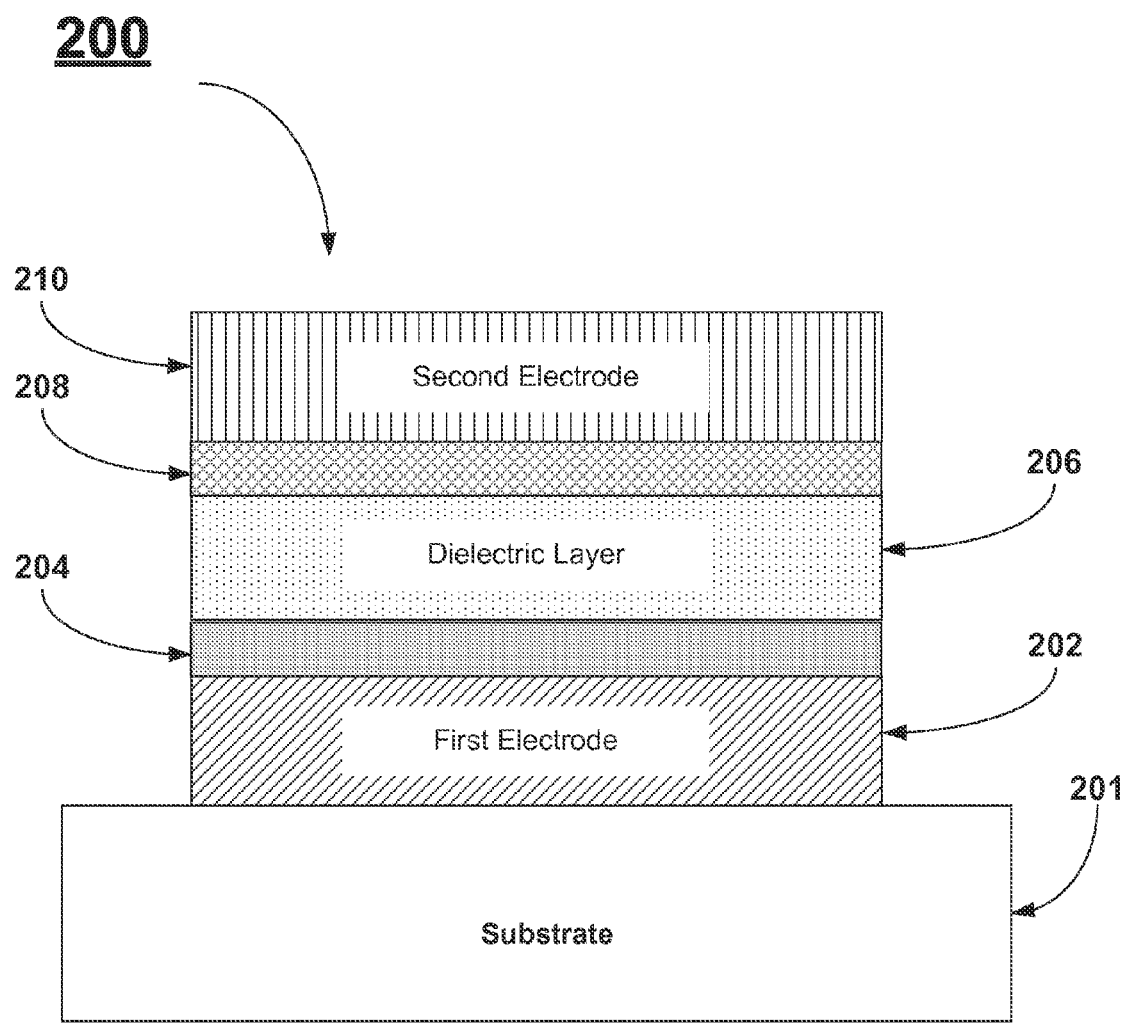
FIG. 2 illustrates a simplified cross-sectional view of a DRAM capacitor stack fabricated in accordance with some embodiments.

FIG. 2 illustrates a simplified cross-sectional view of a DRAM capacitor stack, 200, fabricated in accordance with some embodiments. The capacitor stack includes a first electrode layer, a dielectric layer, and a second electrode layer. The capacitor stack may include other layers as well. In some embodiments, the dielectric layer includes zirconium oxide. The zirconium oxide may further include a dopant. Suitable dopants for use with zirconium oxide dielectric layers include Al, Ce, Co, Er, Ga, Gd, Ge, Hf, La, Mg, Si, Sn, Sr, Ti, Y, or combinations thereof. In some embodiments, the dielectric layer includes titanium oxide. The titanium oxide may further include a dopant. Suitable dopants for use with titanium oxide dielectric layers include Al, Ce, Co, Er, Ga, Gd, Ge, Hf, La, Mg, Si, Sn, Sr, Y, Zr, or combinations thereof. However, those skilled in the art will understand that the present methods may be applied to many dielectric layers. Examples of suitable dielectric layers include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. These dielectric layers may also include dopants.

First electrode layer, 202, is formed above substrate, 201. Generally, the substrate was subjected to one or more processing steps in the manufacture of a full DRAM device. First electrode layer, 202, includes one of metals, metal alloys, conductive metal oxides, conductive metal nitrides, conductive metal silicides, conductive metal carbides, etc. For this example, first electrode layer, 202, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD as discussed previously. The titanium nitride first electrode layer may optionally receive an RTA anneal treatment before the formation of the oxygen donor layer as discussed previously.

First oxygen donor layer, 204, is then formed above the titanium nitride first electrode layer. The thickness of the first oxygen donor layer is typically between 1 A and 25 A. Suitable oxygen donor layers for use with zirconium oxide dielectric layers include one of chromium oxide, cerium oxide, europium oxide, manganese oxide, molybdenum oxide, niobium oxide, tantalum oxide, tin oxide, titanium oxide, tungsten oxide, vanadium oxide, or combinations thereof. Suitable oxygen donor layers for use with titanium oxide dielectric layers include one of chromium oxide, cerium oxide, europium oxide, manganese oxide, molybdenum oxide, niobium oxide, tantalum oxide, tin oxide, tungsten oxide, vanadium oxide, or combinations thereof.

Dielectric layer, 206, is then formed above the first oxygen donor layer. Suitable dielectric layers include at least one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. The dielectric layer may be a single layer or may be formed from multiple layers. In some embodiments, the dielectric layer includes zirconium oxide. The zirconium oxide may further include a dopant. Suitable dopants for use with zirconium oxide dielectric layers include Al, Ce, Co, Er, Ga, Gd, Ge, Hf, La, Mg, Si, Sn, Sr, Ti, Y, or combinations thereof. In some embodiments, the dielectric layer includes titanium oxide. The titanium oxide may further include a dopant. Suitable dopants for use with titanium oxide dielectric layers include Al, Ce, Co, Er, Ga, Gd, Ge, Hf, La, Mg, Si, Sn, Sr, Y, Zr, or combinations thereof.

Second oxygen donor layer, 208, is then formed above the dielectric layer. The thickness of the second oxygen donor layer is typically between 1 A and 25 A. Suitable oxygen donor layers for use with zirconium oxide dielectric layers include one of chromium oxide, cerium oxide, europium oxide, manganese oxide, molybdenum oxide, niobium oxide, tantalum oxide, tin oxide, titanium oxide, tungsten oxide, vanadium oxide, or combinations thereof. Suitable oxygen donor layers for use with titanium oxide dielectric layers include one of chromium oxide, cerium oxide, europium oxide, manganese oxide, molybdenum oxide, niobium oxide, tantalum oxide, tin oxide, tungsten oxide, vanadium oxide, or combinations thereof. In some embodiments, the second oxygen donor layer has the same composition as the first oxygen donor layer. In some embodiments, the second oxygen donor layer has a different composition from the first oxygen donor layer.

Second electrode layer, 210, is then formed above the second oxygen donor layer to form a capacitor stack. Second electrode layer, 210, includes one of metals, metal alloys, conductive metal oxides, conductive metal nitrides, conductive metal silicides, conductive metal carbides, etc. For this example, second electrode layer, 210, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The capacitor stack may receive a PMA treatment as discussed previously.

Figure 3:
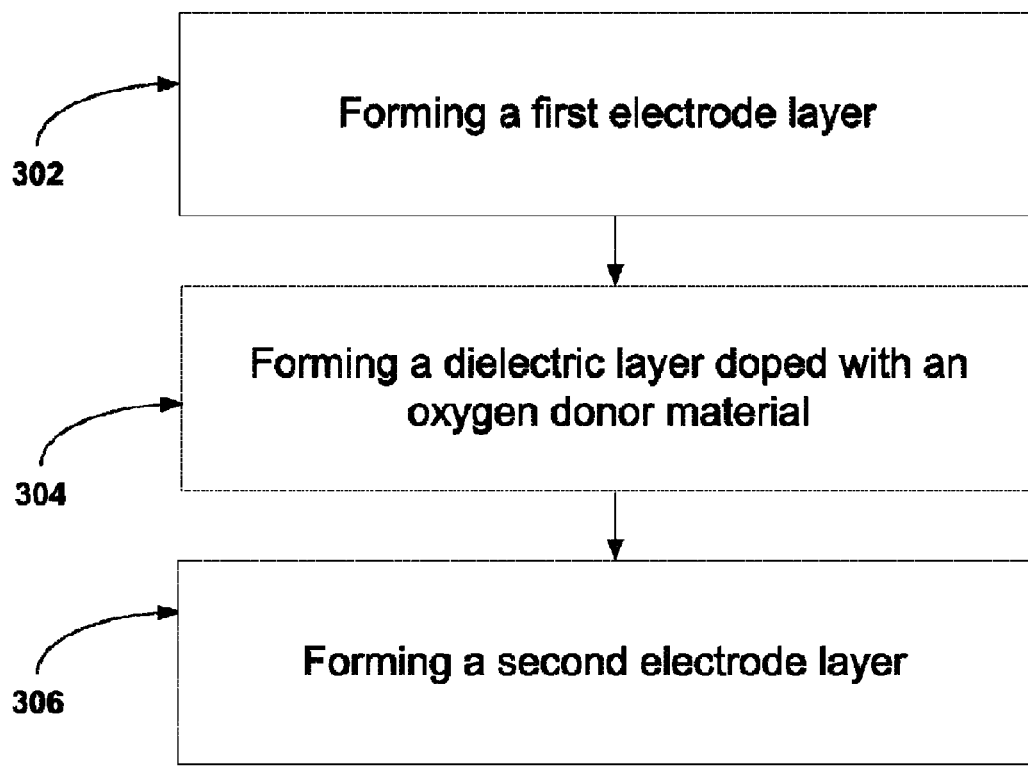
FIG. 3 illustrates a flow chart describing a method for fabricating a DRAM capacitor stack in accordance with some embodiments.

FIG. 3 describes a method, 300, for fabricating a DRAM capacitor stack as described previously. The initial step, 302, involves forming a first electrode layer on a substrate. Examples of suitable electrode layers include metals, metal alloys, conductive metal oxides, conductive metal silicides, conductive metal nitrides, or combinations thereof. A particularly interesting class of materials is the conductive metal oxides. Optionally, the first electrode layer can then be subjected to an annealing process (not shown). If the first electrode layer is a conductive metal nitride material, then the first electrode layer may be annealed using a Rapid Thermal Anneal (RTA) technique or furnace anneal technique. For the RTA case, the temperature is quickly raised in the presence of a nitrogen containing gas such as nitrogen, forming gas, ammonia, etc. as discussed previously. Alternatively, if the first electrode is a conductive metal oxide, then the first electrode layer may be annealed in an inert or reducing atmosphere such as argon, nitrogen, or forming gas as discussed previously.

The next step, 304, involves forming a dielectric layer above the first electrode layer, wherein the dielectric layer includes at least one dopant that may act as an oxygen donor dopant. As used herein, an "oxygen donor dopant" will be understood to describe a dopant wherein an oxide of the dopant has a higher (i.e. less negative) Gibb's free energy change of formation than the dielectric layer. This oxygen donor dopant may donate oxygen to the dielectric layer, thereby reducing the concentration of oxygen vacancies, and thus reduce the leakage current of the capacitor stack as discussed previously. Suitable oxygen donor dopants for use with zirconium oxide dielectric layer include chromium oxide, cerium oxide, europium oxide, manganese oxide, molybdenum oxide, niobium oxide, tantalum oxide, tin oxide, titanium oxide, tungsten oxide, vanadium oxide, or combinations thereof. The oxygen donor dopant may be added to the dielectric layer in a concentration range between 1 atomic % and 20 atomic %. Suitable oxygen donor dopants for use with titanium oxide dielectric layers include chromium oxide, cerium oxide, europium oxide, manganese oxide, molybdenum oxide, niobium oxide, tantalum oxide, tin oxide, tungsten oxide, vanadium oxide, or combinations thereof. The oxygen donor dopant may be added to the dielectric layer in a range between 1 atomic % and 20 atomic %. The dielectric layer may be a single layer or may be formed from multiple layers. The dielectric layer may be subjected to a PDA treatment as discussed previously.

The next step, 306, involves forming a second electrode layer above the dielectric layer to form a capacitor stack.

Typically, the capacitor stack can then be subjected to an annealing process (not shown) as discussed previously.

Figure 4:
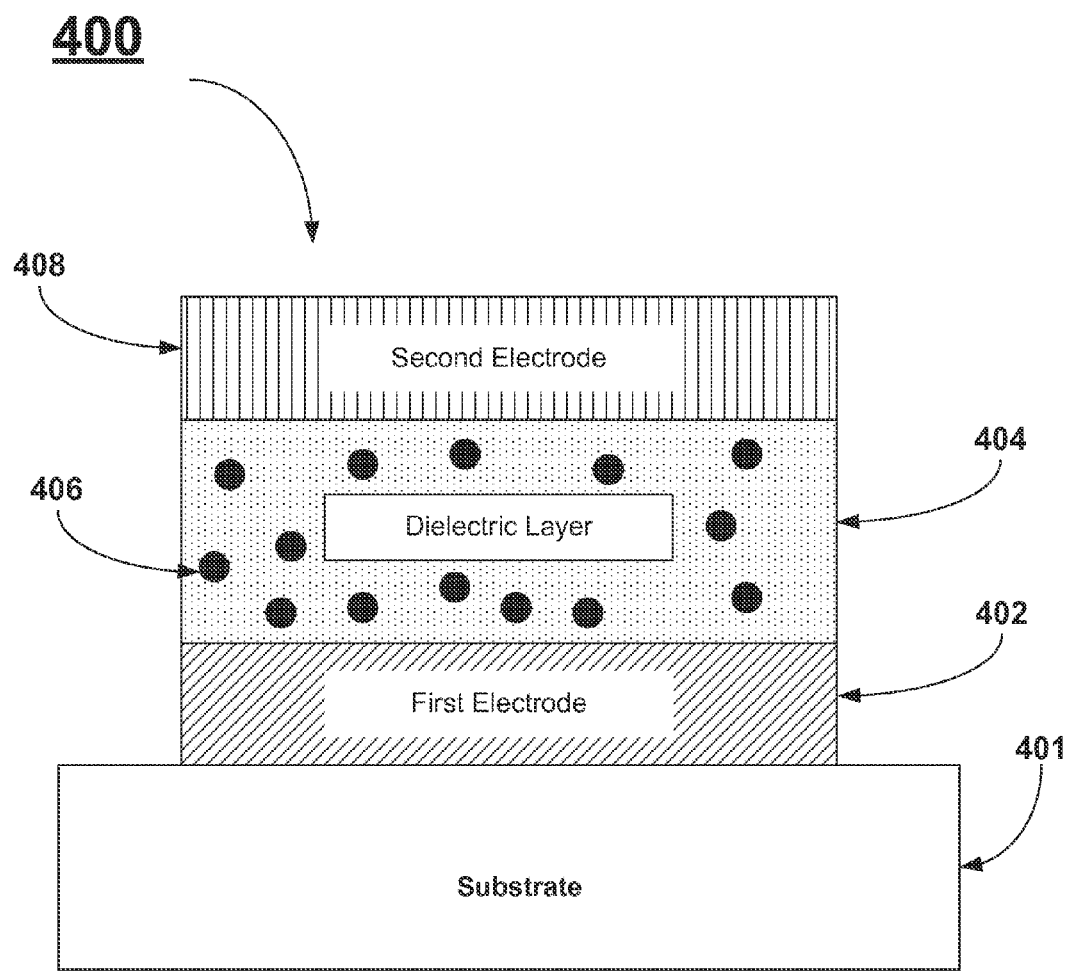
FIG. 4 illustrates a simplified cross-sectional view of a DRAM capacitor stack fabricated in accordance with some embodiments.

FIG. 4 illustrates a simplified cross-sectional view of a DRAM capacitor stack, 400, fabricated in accordance with some embodiments. In some embodiments, the dielectric layer includes zirconium oxide. In some embodiments, the dielectric layer includes titanium oxide.

First electrode layer, 402, is formed above substrate, 401. Generally, the substrate has already received several processing steps in the manufacture of a full DRAM device. First electrode layer, 402, includes one of metals, metal alloys, conductive metal oxides, conductive metal nitrides, conductive metal silicides, conductive metal carbides, etc. For this example, first electrode layer, 402, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The titanium nitride first electrode layer may optionally receive an RTA anneal treatment before the formation of the oxygen donor layer as discussed previously.

Dielectric layer, 404, is formed above the first electrode layer, wherein the dielectric layer includes at least one oxygen donor dopant, 406, that may act as an oxygen donor. This oxygen donor dopant may donate oxygen to the dielectric layer, thereby reducing the concentration of oxygen vacancies, and thus reduce the leakage current of the capacitor stack as discussed previously. The dopant may be introduced into the dielectric layer as part of the formation of the dielectric layer. Suitable oxygen donor dopants for use with zirconium oxide dielectric layers include chromium oxide, cerium oxide, europium oxide, manganese oxide, molybdenum oxide, niobium oxide, tantalum oxide, tin oxide, titanium oxide, tungsten oxide, vanadium oxide, or combinations thereof. The oxygen donor dopant may be added to the dielectric layer in a range between 1 atomic % and 20 atomic %. Suitable oxygen donor dopants for use with titanium oxide dielectric layers include chromium oxide, cerium oxide, europium oxide, manganese oxide, molybdenum oxide, niobium oxide, tantalum oxide, tin oxide, tungsten oxide, vanadium oxide, or combinations thereof. The oxygen donor dopant may be added to the dielectric layer in a range between 1 atomic % and 20 atomic %. The dielectric layer may be a single layer or may be formed from multiple layers. The dielectric layer may be subjected to a PDA treatment as discussed previously.

Second electrode layer, 408, is then formed above the dielectric layer to form a capacitor stack. Second electrode layer, 408, includes one of metals, metal alloys, conductive metal oxides, conductive metal nitrides, conductive metal silicides, conductive metal carbides, and the like. For this example, second electrode layer, 408, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The capacitor stack may receive a PMA treatment as discussed previously.

Figure 5:
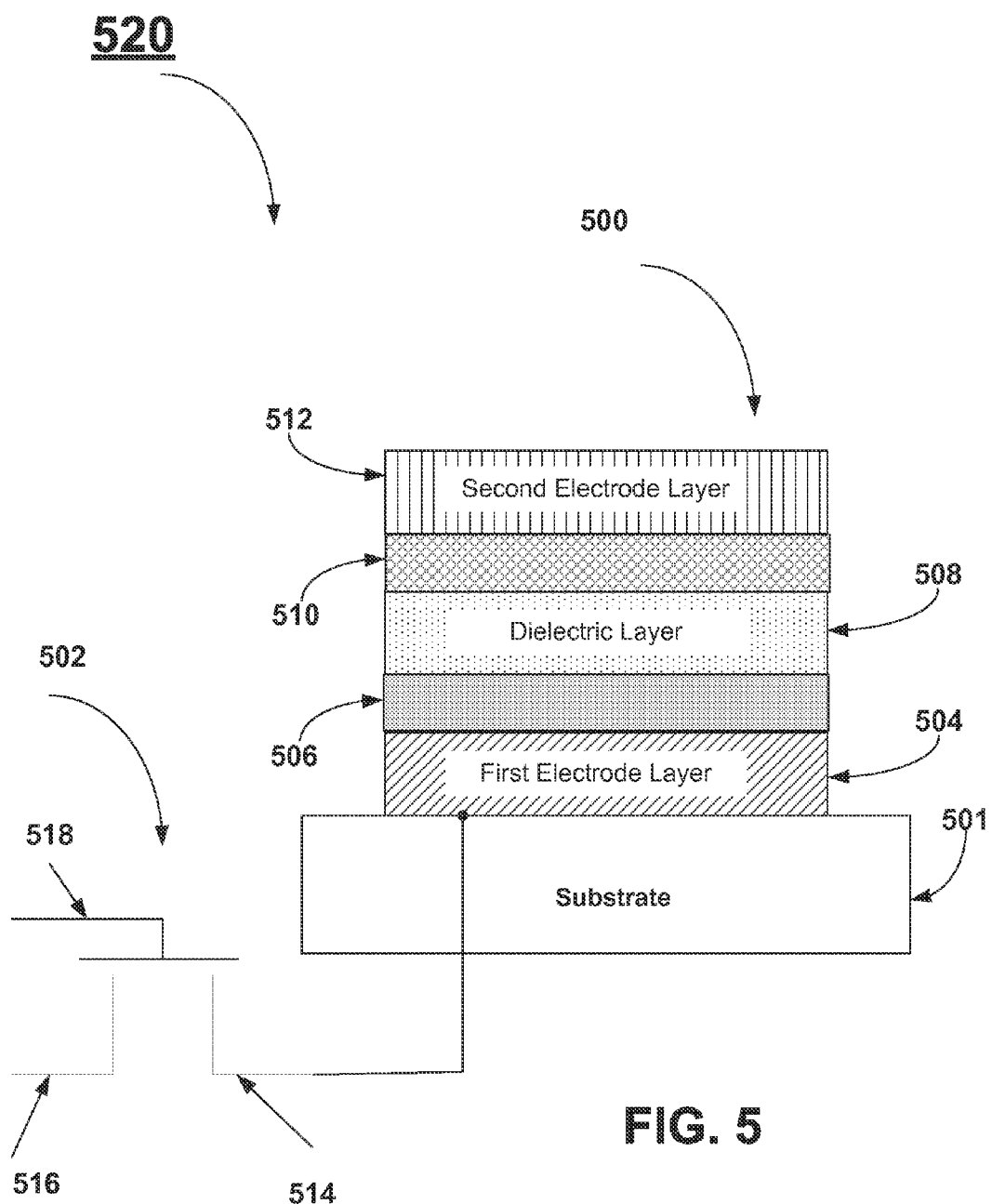
FIG. 5 illustrates a simplified cross-sectional view of a DRAM memory cell fabricated in accordance with some embodiments.

An example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 5 is used to illustrate one DRAM cell, 520, manufactured using a structure as discussed previously in reference to FIG. 2. The cell, 520, is illustrated schematically to include two principle components, a cell capacitor, 500, and a cell transistor, 502. The cell transistor is usually constituted by a MOS transistor having a gate, 518, source, 514, and drain, 516. The gate is usually connected to a word line and one of the source or drain is connected to a bit line. The cell capacitor, 500, has a lower or storage electrode, 504, and an upper or plate electrode, 512. The storage electrode is connected to the other of the source or drain and the plate electrode is connected to a reference potential conductor. The cell transistor is, when selected, turned "on" by an active level of the word line to read or write data from or into the cell capacitor via the bit line.

FIG. 5 illustrates a simplified cross-sectional view of a DRAM cell fabricated in accordance with some embodiments. In some embodiments, the dielectric layer includes zirconium oxide. The zirconium oxide may further include a dopant. Suitable dopants for use with zirconium oxide dielectric layers include Al, Ce, Co, Er, Ga, Gd, Ge, Hf, La, Mg, Si, Sn, Sr, Ti, Y, or combinations thereof. In some embodiments, the dielectric layer includes titanium oxide. The titanium oxide may further include a dopant. Suitable dopants for use with titanium oxide dielectric layers include Al, Ce, Co, Er, Ga, Gd, Ge, Hf, La, Mg, Si, Sn, Sr, Y, Zr, or combinations thereof. However, those skilled in the art will understand that the present methods may be applied to many dielectric layers. Examples of suitable dielectric layers include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof.

As was described previously, the cell capacitor, 500, includes a first electrode layer, 504, formed above substrate, 501. The first electrode layer, 504, is connected to the source or drain of the cell transistor, 502. For illustrative purposes, the first electrode has been connected to the source, 514, in this example. First electrode layer, 504, is formed above substrate, 501. Generally, the substrate has already received several processing steps in the manufacture of a full DRAM device. First electrode layer, 504, includes one of metals, metal alloys, conductive metal oxides, conductive metal nitrides, conductive metal silicides, conductive metal carbides, etc. For this example, first electrode layer, 504, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The TiN first electrode layer may optionally receive an RTA anneal treatment before the formation of the dielectric layer as discussed previously.

First oxygen donor layer, 506, is then formed above the titanium nitride first electrode layer. Suitable oxygen donor layers for use with zirconium oxide dielectric layers include one of chromium oxide, cerium oxide, europium oxide, manganese oxide, molybdenum oxide, niobium oxide, tantalum oxide, tin oxide, tungsten oxide, vanadium oxide, or combinations thereof. Suitable oxygen donor layers for use with titanium oxide dielectric layers include one of chromium oxide, cerium oxide, europium oxide, manganese oxide, molybdenum oxide, niobium oxide, tantalum oxide, tin oxide, tungsten oxide, vanadium oxide, or combinations thereof.

Dielectric layer, 508, is then formed above the first oxygen donor layer. Suitable dielectric layers include at least one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. The dielectric layer may be a single layer or may be formed from multiple layers. In some embodiments, the dielectric layer includes zirconium oxide. The zirconium oxide may further include a dopant. Suitable dopants for use with zirconium oxide dielectric layers include Al, Ce, Co, Er, Ga, Gd, Ge, Hf, La, Mg, Si, Sn, Sr, Ti, Y, or combinations thereof. In some embodiments, the dielectric layer includes titanium oxide. The titanium oxide may further include a dopant. Suitable dopants for use with titanium oxide dielectric layers include Al, Ce, Co, Er, Ga, Gd, Ge, Hf, La, Mg, Si, Sn, Sr, Y, Zr, or combinations thereof.

Second oxygen donor layer, 510, is then formed above the dielectric layer. Suitable oxygen donor layers for use with zirconium oxide dielectric layers include one of chromium oxide, cerium oxide, europium oxide, manganese oxide, molybdenum oxide, niobium oxide, tantalum oxide, tin oxide, tungsten oxide, vanadium oxide, or combinations thereof. Suitable oxygen donor layers for use with titanium oxide dielectric layers include one of chromium oxide, cerium oxide, europium oxide, manganese oxide, molybdenum oxide, niobium oxide, tantalum oxide, tin oxide, tungsten oxide, vanadium oxide, or combinations thereof. In some embodiments, the second oxygen donor layer has the same composition as the first oxygen donor layer. In some embodiments, the second oxygen donor layer has a different composition from the first oxygen donor layer.

Second electrode layer, 512, is then formed above the second oxygen donor layer to form a capacitor stack. Second electrode layer, 512, includes one of metals, metal alloys, conductive metal oxides, conductive metal nitrides, conductive metal silicides, conductive metal carbides, etc. For this example, second electrode layer, 512, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The capacitor stack may receive a PMA treatment as discussed previously.

Figure 6:
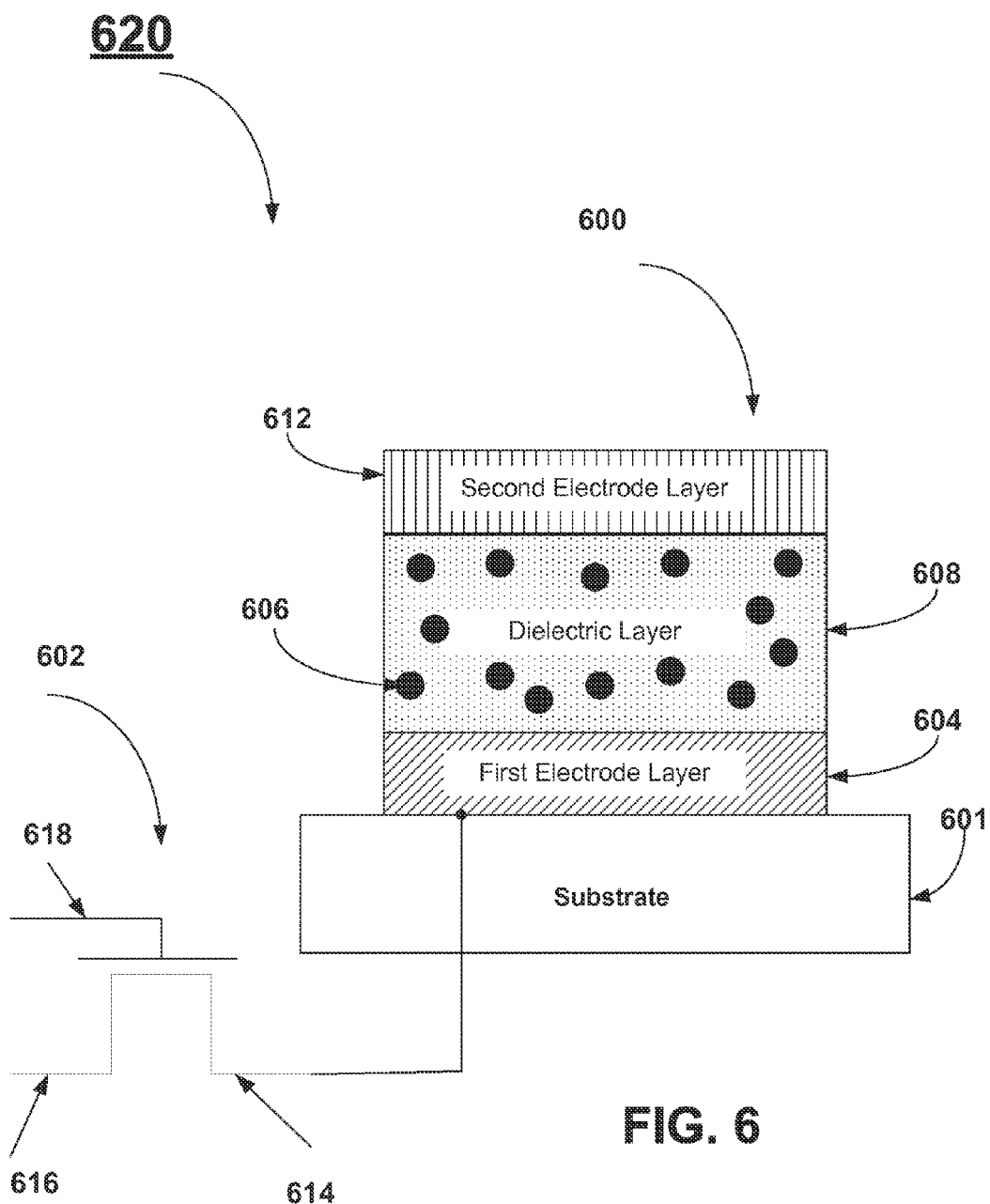
FIG. 6 illustrates a simplified cross-sectional view of a DRAM memory cell fabricated in accordance with some embodiments.

Another example of a specific application of some embodiments is in the fabrication of capacitors used in the memory cells in DRAM devices. FIG. 6 is used to illustrate one DRAM cell, 620, manufactured using a structure as discussed previously in reference to FIG. 4. The cell, 620, is illustrated schematically to include two principle components, a cell capacitor, 600, and a cell transistor, 602. The cell transistor, 602, is usually constituted by a MOS transistor having a gate, 618, source, 614, and drain, 616. The gate, 618, is usually connected to a word line (not shown) and one of the source or drain is connected to a bit line (also not shown). The cell capacitor, 600, has a lower or storage electrode, 604, and an upper or plate electrode, 612. The storage electrode is connected to the other of the source or drain and the plate electrode is connected to a reference potential conductor. The cell transistor is, when selected, turned "on" by an active level of the word line to read or write data from or into the cell capacitor via the bit line.

The example illustrated in FIG. 6 will use zirconium oxide as the dielectric layer. However, those skilled in the art will understand that the present methods may be applied to many dielectric layers. Examples of suitable dielectric layers include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or combinations thereof. The dielectric layer includes at least one oxygen donor dopant that may act as an oxygen donor. This oxygen donor dopant may donate oxygen to the dielectric layer, thereby reducing the concentration of oxygen vacancies, and thus reduce the leakage current of the capacitor stack as discussed previously. The dopant may be introduced into the dielectric layer as part of the formation of the dielectric layer. Suitable oxygen donor dopants for use with zirconium oxide dielectric layers include chromium oxide, cerium oxide, europium oxide, manganese oxide, molybdenum oxide, niobium oxide, tantalum oxide, tin oxide, titanium oxide, tungsten oxide, vanadium oxide, or combinations thereof. The oxygen donor dopant may be added to the dielectric layer in a range between 1 atomic % and 20 atomic %. Suitable oxygen donor dopants for use with titanium oxide dielectric layers include chromium oxide, cerium oxide, europium oxide, manganese oxide, molybdenum oxide, niobium oxide, tantalum oxide, tin oxide, tungsten oxide, vanadium oxide, or combinations thereof. The oxygen donor dopant may be added to the dielectric layer in a range between 1 atomic % and 20 atomic %.

As was described previously, the cell capacitor, 600, includes a first electrode layer, 604, formed above substrate, 601. The first electrode layer, 604, is connected to the source or drain of the cell transistor, 602. For illustrative purposes, the first electrode has been connected to the source, 614, in this example. Generally, the substrate has already received several processing steps in the manufacture of a full DRAM device. First electrode layer, 604, includes one of metals, metal alloys, conductive metal oxides, conductive metal nitrides, conductive metal silicides, conductive metal carbides, etc. For this example, first electrode layer, 604, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The titanium nitride first electrode layer may optionally receive an RTA anneal treatment before the formation of the dielectric layer as discussed previously.

Dielectric layer, 608, is formed above the first electrode layer, wherein the dielectric layer includes at least one dopant that may act as an oxygen donor dopant, 606. This oxygen donor dopant may donate oxygen to the dielectric layer, thereby reducing the concentration of oxygen vacancies, and thus reduce the leakage current of the capacitor stack as discussed previously. The dopant may be introduced into the dielectric layer as part of the formation of the dielectric layer. Suitable oxygen donor dopants for use with zirconium oxide dielectric layers include chromium oxide, cerium oxide, europium oxide, manganese oxide, molybdenum oxide, niobium oxide, tantalum oxide, tin oxide, titanium oxide, tungsten oxide, vanadium oxide, or combinations thereof. The oxygen donor dopant may be added to the dielectric layer in a range between 1 atomic % and 20 atomic %. Suitable oxygen donor dopants for use with titanium oxide dielectric layers include chromium oxide, cerium oxide, europium oxide, manganese oxide, molybdenum oxide, niobium oxide, tantalum oxide, tin oxide, tungsten oxide, vanadium oxide, or combinations thereof. The oxygen donor dopant may be added to the dielectric layer in a range between 1 atomic % and 20 atomic %. The dielectric layer may be a single layer or may be formed from multiple layers. The dielectric layer may be subjected to a PDA treatment as discussed previously.

Second electrode layer, 612, is then formed above the dielectric layer to form a capacitor stack. Second electrode layer, 612, includes one of metals, metal alloys, conductive metal oxides, conductive metal nitrides, conductive metal silicides, conductive metal carbides, etc. For this example, second electrode layer, 612, includes a conductive metal nitride. Examples of such conductive metal nitrides include the conductive compounds of cobalt nitride, molybdenum nitride, nickel nitride, tantalum nitride, titanium nitride, titanium aluminum nitride, tungsten nitride, or combinations thereof. A specific electrode layer of interest is titanium nitride when zirconium oxide is used as the dielectric layer. The titanium nitride is typically formed using PVD, PECVD, CVD, or ALD. The capacitor stack may receive a PMA treatment as discussed previously.

Although the foregoing examples have been described in some detail for purposes of clarity of understanding, the disclosure is not limited to the details provided. There are many alternative ways of implementing the teachings. The disclosed examples are illustrative and not restrictive.

What is claimed:

1. A method for forming a capacitor stack, the method comprising:
   forming a first layer on a substrate,
      wherein the first layer comprises one of a metal, a metal alloy, a conductive metal oxide, a conductive metal nitride, a conductive metal silicide, or a conductive metal carbide;
   forming a second layer above the first layer,
      wherein the second layer is operable as a first oxygen donor layer,
      wherein the second layer comprises one of chromium oxide, cerium oxide, europium oxide, manganese oxide, molybdenum oxide, niobium oxide, tin oxide, tungsten oxide, vanadium oxide, or combinations thereof;
   forming a third layer above the second layer;
   forming a fourth layer above the third layer,
      wherein the fourth layer is operable as a second oxygen donor layer,
      wherein the fourth layer comprises one of chromium oxide, cerium oxide, europium oxide, manganese oxide, molybdenum oxide, niobium oxide, tin oxide, tungsten oxide, vanadium oxide, or combinations thereof; and
   forming a fifth layer above the fourth layer,
      wherein the fifth layer comprises one of a metal, a metal alloy, a conductive metal oxide, a conductive metal nitride, a conductive metal silicide, or a conductive metal carbide, and
      wherein the second layer and the fourth layer each have a Gibb's free energy that is higher than a material included in the third layer.

2. The method of claim 1, wherein the second layer and the fourth layer comprise the same material.

3. The method of claim 1, wherein the second layer and the fourth layer comprise different materials.

4. The method of claim 1, wherein the third layer comprises one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, or zirconium oxide.

5. The method of claim 1, wherein the third layer comprises zirconium oxide.

6. The method of claim 1, wherein the third layer comprises titanium oxide.

7. The method of claim 1, wherein the first layer and the fifth layer each comprises a conductive metal nitride.

8. The method of claim 7, wherein the first layer and the fifth layer each comprises titanium nitride.

9. The method of claim 5, wherein a concentration of the oxygen donor dopant in the second layer is between 1 atomic % and 20 atomic %.

10. The method of claim 7, further comprising annealing the substrate comprising the first layer, the second layer, the third layer, and the fourth layer before forming the fifth layer.

11. The method of claim 10, further comprising annealing the capacitor stack after the forming of the fifth layer.

12. The method of claim 6, wherein a concentration of the oxygen donor dopant in the second layer is between 1 atomic % and 20 atomic %.

13. The method of claim 12, further comprising annealing the substrate comprising the first layer, the second layer, the third layer, and the fourth layer before forming the fifth layer.

14. The method of claim 13, further comprising annealing the capacitor stack after the forming of the fifth layer.

15. The method of claim 1, wherein the oxygen donor dopant in each of the second layer and the fourth layer is operable to donate oxygen to the dielectric material and to reduce a concentration of oxygen vacancies within the dielectric material.

* * * * *